United States Patent [19]
Doyle

[11] Patent Number: 6,054,945
[45] Date of Patent: Apr. 25, 2000

[54] REDUCTION OF COMPARATOR POWER REQUIREMENT IN A SWITCHED CAPACITOR ADC

[75] Inventor: John Doyle, Co. Cork, Ireland

[73] Assignee: University College Cork, Ireland

[21] Appl. No.: 09/010,874

[22] Filed: Jan. 22, 1998

[30] Foreign Application Priority Data

Jan. 22, 1997 [IE] Ireland .................................. S970045

[51] Int. Cl.[7] .................................................. H03M 1/12
[52] U.S. Cl. ........................................... 341/150; 341/172
[58] Field of Search .................................. 341/150, 161, 341/162, 163, 172

[56] References Cited

U.S. PATENT DOCUMENTS

| | | | |
|---|---|---|---|
| 4,922,252 | 5/1990 | Draxelmayr | 341/172 |
| 4,999,633 | 3/1991 | Draxelmayr | 341/150 |
| 5,367,302 | 11/1994 | Kalthoff et al. | 341/163 |
| 5,581,252 | 12/1996 | Thomas | 341/172 |
| 5,646,622 | 7/1997 | Kuttner | 341/172 |

*Primary Examiner*—Howard L. Williams
*Attorney, Agent, or Firm*—Rossi & Associates

[57] ABSTRACT

This application relates to analog to digital converters, particularly AD convertors of the successive approximation type, and to the reduction of power consumption and/or the size of active devices used in these converters. In particular, an analog to digital converter is disclosed in which an array of switched capacitors is decoupled from a comparator. Preferably, this decoupling is achieved using a small capacitor.

8 Claims, 3 Drawing Sheets

REDUCTION OF COMPARATOR POWER REQUIREMENT IN A SWITCHED CAPACITOR ADC

BACKGROUND OF THE INVENTION

1. Field of the Invention

This invention relates to analog to digital converters, ADCs, and in particular to switched capacitor ADCs. The invention is directed to reduction of the comparator power requirement in ADCs, especially ADCs of the foregoing kind.

The invention is especially directed to successive approximation register (SAR) type ADCs.

2. Description of the Prior Art

In ADCs of the kind to which the invention is directed, it has been found that the component requiring a significant level of power input is the comparator. A particular reason for the comparator requiring significant power input is that it serves to autozero the capacitor array of the digital to analog converter portion of the ADC. In order to facilitate achievement of the autozero operation in a sufficiently speedy manner, the comparator requires to be a large device running at a high current level.

BRIEF SUMMARY OF THE INVENTION

It is an objective of the invention to reduce the power requirement of ADC devices of the kind previously discussed.

According to the invention, this reduction in power requirement is achieved by decoupling the capacitor array from the comparator, for example by use of a small signal-connecting capacitor.

More specifically therefore, the invention provides an analog/digital converter comprising an array of capacitors, a comparator disposed between said array of capacitors and an output of the converter and means for decoupling the capacitor array from the comparator.

Said means for decoupling the capacitor array from the comparator preferably comprises a capacitor. Said capacitor for decoupling the capacitor array from the comparator is suitably of a value which is small compared with the aggregate value of said capacitor array.

In one embodiment of the converter of the invention, means are provided for switchably connecting an input voltage to the capacitors of said array. In another embodiment of the converter of the invention, the input voltage is switchably connected to said comparator by means of a second decoupling capacitor. Preferably said second decoupling capacitor is of substantially the same value as said capacitor for decoupling the array of capacitors from the comparator. Optionally calibration means may be provided for reducing mismatch between said second decoupling capacitor and said capacitor for decoupling the array of capacitors from the comparator. In a preferred embodiment of the converter of the invention, said capacitor array preferably also comprises a coupling capacitor from a sub-DAC of the converter.

BRIEF DESCRIPTION OF THE DRAWINGS

The invention will now be described having regard to the accompanying drawings, in which.

DETAILED DESCRIPTION OF THE DRAWINGS

The invention is now discussed with particular reference to a successive approximation register (SAR) type ADC having three major components, a DAC, a comparator, and successive approximation logic, the latter not being discussed in detail herein. The DAC of the ADC is composed in the present example of capacitors defining a capacitor array. The invention is particularly addressed to improving the method of connecting the DAC to the comparator. The invention is discussed by way of example in terms of a 12 bit converter, but is applicable to switched capacitor ADCs of any resolution. In the exemplary arrangement discussed and shown, a 12 bit arrangement is used in which a 7 bit main DAC and a 5 bit sub-DAC (which acts in a manner similar to a Vernier) cooperate to provide a converter requiring only 159 capacitors, as compared with a requirement for 4096 capacitors if a single capacitor array were provided to handle 12 bit resolution.

In the prior art arrangement of FIG. 1 and also in the novel arrangements of FIGS. 2 and 3, each bit in the data conversion represents twice the weight of the one below it and so on. Thus in the main DAC, by proceeding from bit 0 to bit 6, a range of 64 is traversed, in accordance with the following tabulation

|  | Bit 0 | Bit 1 | Bit 2 | Bit 3 | Bit 4 | Bit 5 | Bit 6 |
| --- | --- | --- | --- | --- | --- | --- | --- |
| Unit Capacitors | 64 | 32 | 16 | 8 | 4 | 2 | 1 |
| Capacitance (pF) | 32 | 16 | 8 | 4 | 2 | 1 | 0.5 |

It may be noted that the sub-DAC (shown only in block diagram format in the figures) is of a construction similar to the main DAC, except it is only a five bit DAC instead of a seven bit DAC. Thus, in the sub-DAC, for bits 7 to 11, five elements are provided, in accordance with the following Table:

|  | Bit 7 | Bit 8 | Bit 9 | Bit 10 | Bit 11 |
| --- | --- | --- | --- | --- | --- |
| Unit capacitors | 16 | 8 | 4 | 2 | 1 |
| Capacitance (pF) | 8 | 4 | 2 | 1 | 0.5 |

Accordingly, the aggregate capacitance in the main DAC is 63.5 pF (127 capacitor units) and the aggregate capacitance in the sub-DAC is 15.5 pF (31 capacitor units). The capacitor values and the designation of each capacitor unit as having a value of 0.5 pF is purely exemplary and other values, for example smaller values of capacitance, may suffice in alternative exemplifications of different resolutions.

Figure 1:
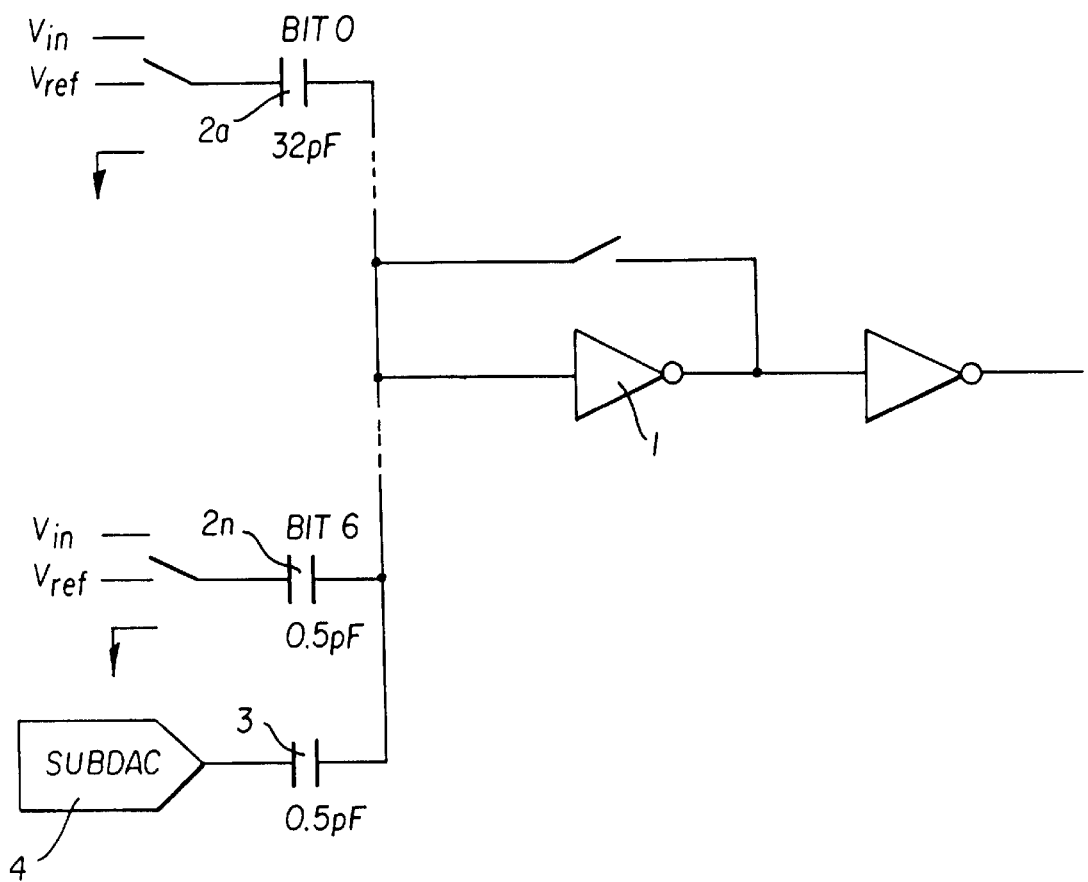
FIG. 1 shows a known manner of connecting the DAC of an ADC converter of the kind to which the invention relates to the comparator of the converter.

Adverting to FIG. 1, there is shown a known implementation of an ADC, in which the component requiring a high level of power is the comparator 1. This ADC performs a conversion in two stages.

In the first stage, it acquires the input voltage onto the capacitor array. It does this by connecting the capacitor array to Vin and closing the switch between the input and output of inverter 1. The closure of the switch sets the inverter up at its own reference point—it is an autozero operation. The delay introduced by this autozero operation is proportional to the product of the capacitive load (in this instance the DAC capacitor array) and the effective resistance presented by the comparator. This resistance is the combination of the switch resistance and the resistance presented by the inverter, which is the inverse of its transconductance. Therefore, in order to keep this delay small, the switch is large to reduce its resistance (for which there is no power penalty) and the inverter is designed to have a high transconductance, i.e. it has large devices running at a high current level, which does entail a power penalty.

In the second stage of conversion, the compare phase, the switch connecting the input and output of inverter 1 is opened, and now it, in combination with the succeeding inverters, is free to act as a comparator. Successive bits of the DAC are switched to Vref or Ground, and the comparator indicates, in the normal mode of SAR conversion, the appropriate setting of these bits. In this mode, delays are set by the capabilities of the technology—i.e. they are related to the intrinsic gate delay and are independent of device size.

The high power requirement of the comparator 1 is a result of its being required to autozero the capacitor array (2a–2n, 3) comprising inter alia the MSB (most significant bits) section (2a–2n) of the DAC and the coupling capacitor 3 of the sub-DAC 4. In the exemplification shown, the capacitor array amounts to 128 capacitor units, each of 0.5 picofarads, i.e. 64 pF in total. In order to autozero such an array in a reasonable amount of time, the effective resistance of the comparator front end must be kept small, in order to keep the resistor-capacitor time constant small. In other words, the transconductance of the comparator front end must be large. Accordingly, a large device running at a high current level is necessary. The autozero requirement arises as the comparator 1 needs a particular DC level at its input. The autozero requirement does not result from any setting of the capacitor array (2a–2n, 3), which functions essentially in an AC manner. As shown therefore in FIG. 1, all seven MSB capacitors (2a–2n) plus the coupling capacitor 3 from the sub-DAC 4 are connected into the input of the comparator, which is required to autozero the capacitors (2a–2n, 3).

The invention effects a reduction in the power requirements of the device by decoupling the load of the capacitor array (2a–2n, 3) from the comparator 1. This is achieved by means of a small connecting capacitor 5, as shown in FIG. 2, which connects or transmits the signal from the capacitor array (2a–2n, 3) to the comparator 1, while functioning in a load-decoupling manner so far as appearance of the load of the capacitor array (2a–2n, 3) at the comparator 1 is concerned. The seven MSBs (2a–2n) and the coupling capacitor 3 from the sub-DAC 4 feed into this connecting capacitor 5, the connecting capacitor 5 then in turn feeding into the comparator 1. In this way, the power requirements of the comparator 1 are considerably reduced, as the comparator 1 only requires to autozero the series combination of connecting capacitor 5 and the DAC capacitors, which is very much smaller in value than the value of the DAC capacitor array (2a–2n) plus the connecting capacitor 3 from the sub-DAC 4. In fact, this series combination actually presents a slightly smaller capacitive load than the connecting capacitor on its own.

The coupling capacitor 5 may be as small as 1 capacitor unit, i.e. 0.5 picofarad, compared to up to 128 capacitor units in the main capacitor array (2a–2n, 3). Accordingly, the size and power requirement of the capacitor front end are proportionately reduced.

The reduction in inverter size does not however impair speed. Neither does the construction of the invention impair the autozero portion of the conversion, as a similar or better RC constant is maintained. In the comparison portion of the conversion, there is again no adverse effect as a result of the modification of the invention, as in the absence of loading, a small inverter is as fast as a big one.

Figure 2:
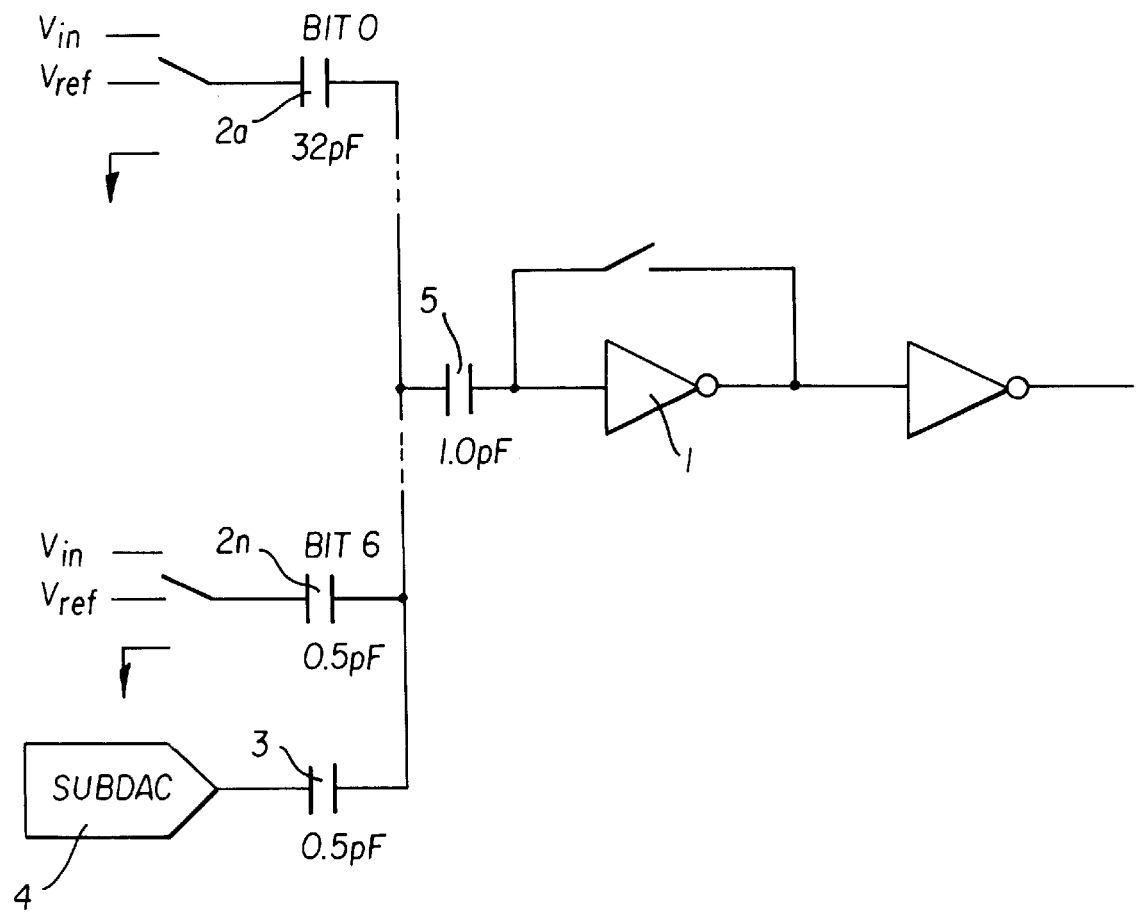
FIG. 2 shows one manner of connecting the DAC to the comparator in accordance with the principles of the invention.
Figure 3:
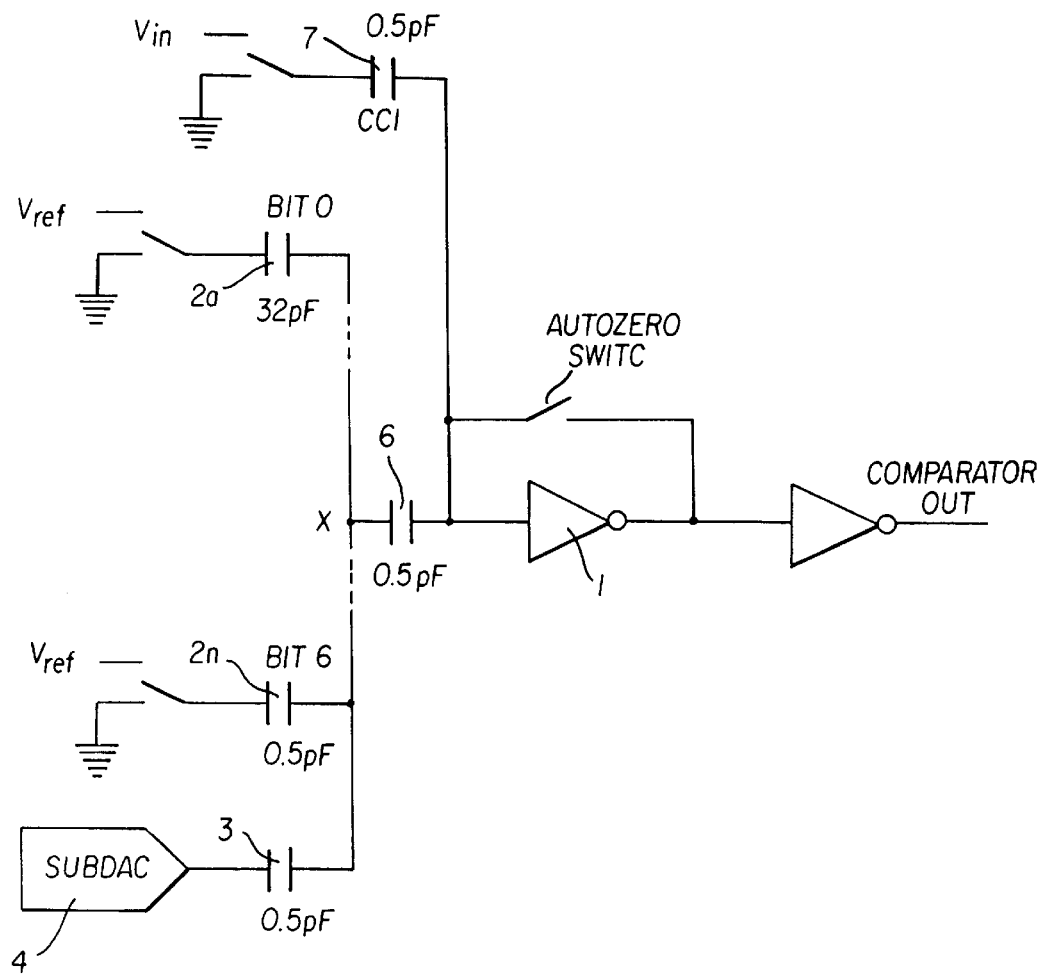
FIG. 3 shows a variant of the arrangement of FIG. 2.

In an alternative implementation of the scheme of the invention to reduce the comparator power requirement in a switch capacitor ADC, shown in FIG. 3, two small connecting capacitors 6, 7 to the comparator 1 are used. The first capacitor 6 (CCD) connects the DAC (2a–2n) and capacitor 3 from the sub-DAC 4 to the comparator 1, as in the embodiment of FIG. 2, while the second capacitor 7 (CCI) connects the input voltage Vin to the comparator. In this implementation, the DAC (2a–2n) is only switched between Vref and ground. The DAC (2a–2n) does not need to connect to Vin, as this is taken care of by the second capacitor 7 (CCI).

The simplest mode of ADC operation is then as follows. Initially capacitor 7 (CCI) is connected to Vin and the DAC capacitor array (2a–2n) is connected to ground. The comparator 1 is autozeroed. The comparator 1 is now taken out of autozero, i.e. it is put into compare mode, by opening the autozero switch. Capacitor 7 (CCI) is now switched to ground, forcing the input voltage of the comparator 1 below the autozero point. The DAC (2a–2n) and the sub-DAC are now exercised by a successive approximation logic. This operates via the normal SAR algorithm to change the voltage at node X to bring the comparator 1 back to its autozero point, via capacitor 6 (CCD). At this stage, the total change in the DAC (2a–2n) output from its initial level at the start of conversion, i.e. the change in voltage at node X, is equal to the Vin previously applied by capacitor 7 (CCI), and so the bit pattern driving the DAC (2a–2n) is a digital representation of Vin, as in any ADC conversion.

This results in advantages similar to those of the scheme described with regard to FIG. 2, namely a considerably smaller capacitive load for the comparator first stage during autozero than in the known switched capacitor ADC scheme of FIG. 1. There is therefore a resultant reduction in comparator power requirement. A further advantage is provided by the capacitive load presented to Vin being smaller than in the implementation of FIG. 2. A lesser driving requirement is therefore presented for setting Vin, possibly allowing even further system power savings. As against these gains, a somewhat larger capacitive load is presented to the comparator as compared with the arrangement of FIG. 2, while a gain error, which may however be calibrated out, may be introduced by mismatch between the capacitors 7 (CCI) and 6 (CCD). Such mismatch may be addressed by the incorporation of suitable calibration arrangements or features in the converter of the invention. An example of such a calibration feature might include the suitable means for adjusting the reference voltage, Vref.

I claim:

1. An analog to digital converter comprising:
   (a) an array of capacitors,
   (b) a comparator disposed between said array of capacitors and an output of the converter,
   (c) a capacitor disposed between the capacitor array and the comparator, said capacitor having a value which is small compared with the aggregate value of said array of capacitors, and
   (d) means for connecting an input voltage to said comparator through a second decoupling capacitor, wherein said second decoupling capacitor is of substantially the same value as said capacitor disposed between the array of capacitors and the comparator.

2. A converter according to claim 1, further comprising means for switchably connecting a comparator input voltage to the capacitors of said array.

3. A converter according to claim 1, further comprising calibration means for reducing mismatch between said second decoupling capacitor and said capacitor disposed between the array of capacitors and the comparator.

4. A converter according to claim 1, wherein said array of capacitors comprises a coupling capacitor from a sub-DAC of the converter.

5. A successive approximation type analog to digital converter comprising:

(a) an array of capacitors, (b) a comparator disposed between said array of capacitors and an output of the converter, (c) a capacitor disposed between the capacitor array and the comparator, said capacitor having a value which is small compared with the aggregate value of said array of capacitors, and (d) means for connecting an input voltage to said comparator through a second decoupling capacitor, wherein said second decoupling capacitor is of substantially the same value as said capacitor disposed between the array of capacitors and the comparator.

6. A converter according to claim 5, comprising means for switchably connecting a comparator input voltage to the capacitors of said array.

7. A converter according to claim 5, comprising calibration means for reducing mismatch between said second decoupling capacitor and said capacitor disposed between the array of capacitors and the comparator.

8. A converter according to claim 5, wherein said array of capacitors comprises a coupling capacitor from a sub-DAC of the converter.

* * * * *

UNITED STATES PATENT AND TRADEMARK OFFICE
CERTIFICATE OF CORRECTION

PATENT NO : 6,054,945
DATED : April 25, 2000
INVENTOR(S): John DOYLE

It is certified that error appears in the above-identified patent and that said Letters Patent are hereby corrected as shown below:

IN FIGURE 3:

Please correct the spelling of the label from "AUTOZERO SWITC" to --AUTOZERO SWITCH--.

Signed and Sealed this

Twenty-fourth Day of April, 2001

*Attest:*

NICHOLAS P. GODICI

*Attesting Officer*  *Acting Director of the United States Patent and Trademark Office*